United States Patent
Hu et al.

[11] Patent Number: 5,942,340
[45] Date of Patent: Aug. 24, 1999

[54] INDOLOCARBAZOLE ELECTROLUMINESCENT DEVICES

[75] Inventors: Nan-Xing Hu, Oakville; Shuang Xie, Mississauga; Zoran D. Popovic, Mississauga; Beng S. Ong, Mississauga; Ah-Mee Hor, Mississauga, all of Canada

[73] Assignee: Xerox Corporation, Stamford, Conn.

[21] Appl. No.: 08/942,598

[22] Filed: Oct. 2, 1997

[51] Int. Cl.$^6$ .................................................. H05B 33/18
[52] U.S. Cl. ........................ 428/690; 428/216; 428/917; 548/416; 548/418; 313/504
[58] Field of Search .................... 548/416, 418; 428/690, 917, 216; 313/504

[56] References Cited

U.S. PATENT DOCUMENTS

| | | | |
|---|---|---|---|
| 3,172,862 | 3/1965 | Gurnee et al. | 252/301.3 |
| 3,530,325 | 9/1970 | Mehl et al. | 313/108 |
| 4,356,429 | 10/1982 | Tang | 313/503 |
| 4,539,507 | 9/1985 | VanSlyke et al. | 313/504 |
| 4,885,211 | 12/1989 | Tang et al. | 428/457 |
| 5,150,006 | 9/1992 | Van Slyke et al. | 313/504 |
| 5,151,629 | 9/1992 | VanSlyke | 313/504 |
| 5,487,953 | 1/1996 | Shirota et al. | 428/690 |
| 5,516,577 | 5/1996 | Matsuura et al. | 428/212 |
| 5,554,450 | 9/1996 | Shi et al. | 428/690 |

OTHER PUBLICATIONS

J. Appl. Phys.65 (9), May 1, 1989, pp. 3610–3616, "Electroluminescence of doped organic thin films", C.W. Tang et al.

*Primary Examiner*—Ellis Robinson
*Assistant Examiner*—George Weeks
*Attorney, Agent, or Firm*—E. O. Palazzo

[57] ABSTRACT

An organic electroluminescent device member comprised of a charge transport component of an indolocarbazole represented by Formulas (I), (II), (III), (IV), (V), or (VI); or optionally mixtures thereof (I)

(II)

(III)

-continued

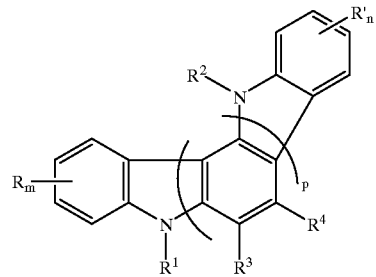
(IV)

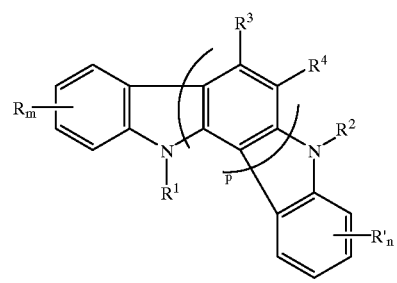
(V)

-continued

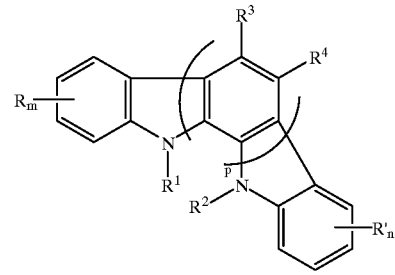
(VI)

wherein R and R' are independently selected from the group consisting of a hydrogen atom, halogen atom, alkyl, alkoxyl, and aryl; m and n are numbers of 0 to 4; $R^1$ and $R^2$ are independently selected from the group consisting of alkyl, aryl, and vinyl; $R^3$ and $R^4$ are independently selected from the group consisting of a hydrogen atom, halogen atom, alkyl, alkoxy, and aryl, and p is a number from 1 to 3.

22 Claims, 1 Drawing Sheet

INDOLOCARBAZOLE ELECTROLUMINESCENT DEVICES

PENDING APPLICATIONS

Illustrated in copending applications U.S. Ser. No. 08/942,647, U.S. Ser. No. 08/942,882, and U.S. Pat. No. 5,843,607, filed concurrently herewith, are EL devices. The disclosures of each of these applications are totally incorporated herein by reference.

Also, illustrated in copending applications U.S. Pat. No. 5,763,110, U.S. Ser. No. 08/707,260, U.S. Pat. No. 5,846,666, U.S. Ser. No. 807,489, U.S. Pat. No. 5,891,587 and U.S. Ser. No. 08/829,398, the disclosures of each being totally incorporated herein by reference, are EL devices.

A number of the EL components of the copending applications, such as the anode, cathode, electron injectors, electron transports, and the like, can be selected for the EL devices of the present invention in embodiments thereof.

BACKGROUND OF THE INVENTION

This invention is generally directed to electroluminescent (EL) devices, or members, and more specifically, to organic EL devices with enhanced thermal and operational stability, and thus improved device durability, and which devices contain charge, especially hole transport components, or compounds comprised of indolocarbazole compounds, such as those of the formulas illustrated herein.

There has been an increased interest in developing energy-efficient flat-panel displays based on organic EL devices primarily because of their potential as an emissive display technology which offers unrestricted viewing angles and high luminescence output at low operating voltages. However, despite recent advances that have been accomplished in EL device design and fabrication, a number of the current available EL device performance characteristics are not effectively suited for practical applications. These characteristics include short serviceable life, high operating voltages, and low EL efficiency, and the rectification of all these performance deficiencies represents one formidable challenge in EL device research and development. Accordingly, one of the features of the present invention in embodiments thereof is to provide organic EL devices which provide extended device life span and excellent EL efficiency.

PRIOR ART

Prior art organic EL devices can contain a laminate comprised of an organic luminescent material and electrodes of opposite polarity, which devices include a single crystal material, such as single crystal anthracene, as the luminescent substance reference, for example, in U.S. Pat. No. 3,530,325. However, these devices require excitation voltages on the order of about 100 volts or greater. Subsequent modifications of the device by the incorporation of additional layers, such as charge injecting and charge transport layers, have provided some performance improvement.

Illustrative examples of EL devices have been disclosed in publications by Tang et al. in *J. Appl. Phys.*, vol. 65, pp. 3610 to 3616 (1989) and Saito et al. in *Mol. Cryst. Liq. Cryst.*, vol. 253, pp. 125 to 132 (1994), the disclosures of which are totally incorporated herein by reference.

An organic dual layered EL device is generally comprised of one hole transport layer adjacent to the anode supporting hole injection and transport, and an electron transport layer adjacent to the cathode supporting electron injection and transport. The recombination of charge carriers and subsequent emission of light is accomplished in one of these layers near their interface. Optionally, a fluorescent material which is capable of emitting light in response to electron-hole recombination can be added to one of said layers. In another configuration, an EL device can be comprised of three separate layers, a hole transport layer, an emission layer, and an electron transport layer, which are laminated in sequence, and are sandwiched as a whole between an anode and a cathode.

Specifically, U.S. Pat. No. 4,356,429 discloses an EL device formed of an organic luminescent medium consisting of a hole transporting layer and an electron transporting layer, wherein the hole transporting layer is comprised of a porphyrinic compound. Further, in U.S. Pat. No. 4,539,507 there was substituted an aromatic tertiary amine layer for the hole transporting porphorinic layer. Illustrative examples of the aromatic tertiary amine compounds disclosed in the '507 patent are triphenylamines, such as N,N,N-triphenylamine and N,N,N-tri-p-tolylamine, those containing at least two aromatic tertiary amine moieties such as 1,1-bis(4-ditolylaminophenyl)cyclohexane, and tetraaryidiamines such as N,N'-bis(3-methylphenyl)-N,N'-diphenyl-4,4'-diaminobiphenyl, N,N,N'N'-tetra-p-tolyl-4,4'-diaminobiphenyl. Also, of interest with respect to EL devices are U.S. Pat. Nos. 5,487,953 and 5,554,450.

While hole transport materials comprised of the above-mentioned aromatic tertiary amines are generally known to facilitate hole injection and hole transport processes, the thermal and morphological instabilities of these materials as the hole transport layers have led to relatively poor EL performance and short operational life. There is also a need to develop hole transport materials which are readily accessible synthetically, and which can be prepared in high yields and with excellent electronic purity. Another need resides in the provision of new hole transport materials which are capable of forming thermally and morphologically stable thin films by for example, vacuum deposition techniques. A still further need is the preparation of new hole transport materials suitable for organic EL device applications, and which materials possess excellent hole transport characteristics, enabling the EL devices to operate at low voltages of, for example, below 20 volts. These and other needs can be achievable with the EL devices of the present invention in embodiments thereof.

FIGURES

Illustrated in FIGS. 1 and 2 are EL devices of the present invention.

SUMMARY OF THE INVENTION

It is a feature of the present invention to provide organic EL devices with many of the advantages illustrated herein.

Another feature of the present invention is to provide organic EL devices with enhanced thermal stability and operational stability.

A further feature of the present invention relates to the provision of novel performance enabling charge, especially hole transport materials for organic EL devices.

In another feature of the present invention there are provided improved EL devices which exhibit high electroluminescence efficiency at relatively low operating voltages of, for example, below about, or about equal to 25 volts, such as from about 5 to about 20 volts.

In yet in another feature of the present invention there are provided improved EL devices comprised of an anode, a cathode, and an organic electroluminescent element sandwiched in between the anode and the cathode, and wherein the organic electroluminescent element is comprised of at least one layer containing an indolocarbazole hole transport component.

An associated feature of the present invention is the provision of EL devices with indolocarbazole compounds which possess excellent hole transporting capabilities, superior thermal stability, and can be vacuum deposited as thin film EL hole transport components.

These and other features of the present invention are accomplished in embodiments thereof by the provision of layered organic EL devices comprised of an anode, a cathode, and sandwiched between the anode and the cathode an organic electroluminescent element comprised of a hole transporting layer containing an indolocarbazole compound, an electron transporting layer, and which devices possess a number of advantages including improved thermal stability, long service life, high electroluminescence efficiency, superior hole and electron injecting and transporting characteristics, and can be fabricated using vacuum deposition techniques. More specifically, the EL devices of the present invention in embodiments thereof provide improved thermal and operational stability, and excellent device durability at temperatures about equal to, or above about 45° C..

In embodiments, the present invention relates to organic EL devices, or members comprised of an anode, a hole transporting layer, an electron transporting layer, and a cathode, and wherein the transporting layer contains at least one indolocarbazole compound represented by the following Formulas (I) through (VI), that is (I), (II), (III), (IV), (V), or (VI); or mixtures thereof

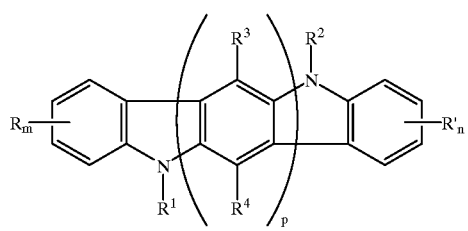
(I)

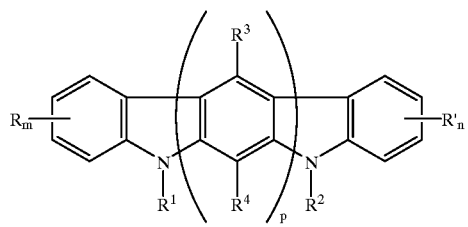
(II)

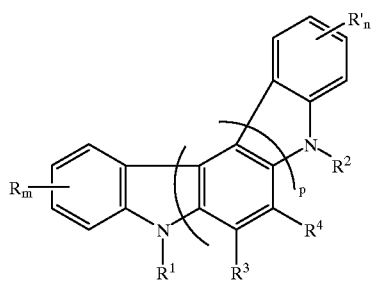
(III)

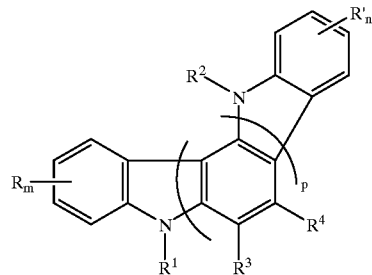
(IV)

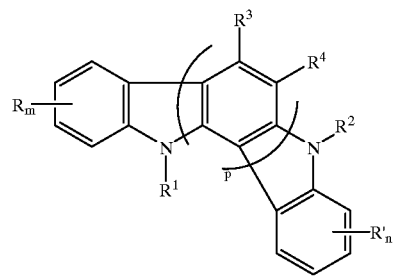
(V)

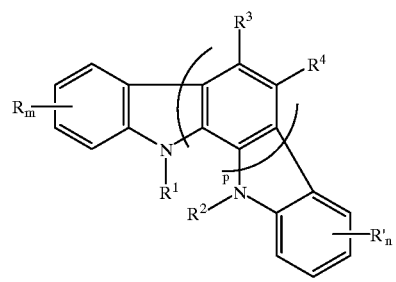
(VI)

wherein R and R' are independently selected from the group consisting of a hydrogen atom, a halogen atom, alkyl, alkoxyl, and aryl; m and n are numbers, preferably of 0 to 4; $R^1$ and $R^2$ are independently selected from the group consisting of alkyl, aryl, and vinyl; $R^3$ and $R^4$ are hydrogen atom, alkyl, alkoxy, aryl, or a halogen atom; and p is a number, preferably of from 1 to 3. Alkyl can contain from about 1 to about 25 carbon atoms; alkoxy can contain from about 1, preferably 2, to about 25 carbon atoms; aryl can contain from about 6 to about 30 carbon atoms; and aryl may be substituted with, for example, alkyl, alkoxy, and the like.

In embodiments the present invention relates to a member, or EL device wherein aryl is a fused aromatic ring; a member wherein the fused ring is benzo; a member wherein alkyl contains from 1 to about 25 carbon atoms, alkoxy contains from 1 to about 25 carbon atoms, and aryl contains from 6 to about 30 carbon atoms; a member wherein alkyl contains from 1 to about 10 carbon atoms, alkoxy contains from 2 to about 12 carbon atoms, and aryl contains from 6 to about 1 8 carbon atoms; a member wherein alkyl contains from 1 to about 6 carbon atoms, and wherein alkoxy contains from 1 to about 6 carbon atoms; a member wherein alkyl is methyl, ethyl, propyl, butyl, pentyl, heptyl, or hexyl, wherein alkoxy is methoxy, ethoxy, propoxy, butoxy, pentoxy, or heptoxy, and aryl is phenyl, or naphthyl; a member wherein said halogen atom is an atom of chlorine, bromine, fluorine, or iodine; a member wherein m and n are the numbers 1, 2, 3, or 4; a member wherein R and R' are hydrogen, or alkyl, and $R^1$ and $R^2$ are aryl; a member wherein $R^3$ and $R^4$ are hydrogen atoms; a member wherein R¹ and R² are independently selected from the group consisting of phenyl, naphthyl, and biphenyl; a member wherein indolocarbazole (I), or (II) is selected; a member or EL device wherein said indolocarbazole is a hole transport of 5,11-di-m-tolyl-5,11-dihydroindolo[3,2-b] carbazole, 5,11-bis(3,4-dimethylphenyl)-5,11-dihydroindolo[3,2-]carbazole, 5,11-di-1-naphthyl-5,11-dihydroindolo[3,2-b]carbazole, 5,11-bis(3-methoxyphenyl)-5,11-dihydroindolo[3,2-b]carbazole, 5,11-bis(1,1'-biphenyl-4-yl)-5,11-dihydroindole[3,2-b]carbazole, 5,11-di-2-naphthyl-5,11-dihydroindole[3,2-b]carbazole, or 2,8-dimethyl-5,11-di-1-naphthyl-5,11-dihydroindolo[3,2-]carbazole; a member including an anode and a cathode, and an organic electroluminescent zone situated between the anode and cathode, and wherein said organic electroluminescent zone comprises a hole transporting indolocarbazole of (I), (II), (III), (IV), (V), or (VI); a member or EL device further including a supporting substrate, an anode, a hole transporting layer, an electron transporting layer, and a cathode, wherein said anode is comprised of a layer of indium tin oxide with a thickness ranging from about 30 nanometers to about 100 nanometers, wherein said hole transport layer contains at least one of said indolocarbazole compounds with a thickness ranging from about 10 nanometers to about 100 nanometers, said electron transporting layer is comprised of a layer of a metal chelate compound with a thickness ranging from about 10 nanometers to about 100 nanometers, and said cathode is a magnesium/silver alloy or a lithium/aluminum alloy, and which cathode is of a thickness ranging from about 10 nanometers to about 200 nanometers; a member including a substrate, an anode, a cathode, and situated between the anode and cathode a hole injector layer, said charge transporting indolocarbazole layer, and thereover an electron transport layer, and an electron injector layer; an EL device wherein the anode is indium tin oxide with a thickness ranging from about 30 nanometers to about 100 nanometers, the cathode is a magnesium silver alloy, the hole injector layer is comprised of a porphyrin compound with a thickness ranging from about 5 nanometers to about 50 nanometers, the charge transporting layer is a hole transporting layer comprised of said indolocarbazole compound with a thickness ranging from about 10 nanometers to about 80 nanometers, the electron transport is comprised of a metal chelate compound of 8-hydroxyquinoline with a thickness ranging from about 10 nanometers to about 80 nanometers, and the electron injector is comprised of a metal chelate compound of 8-quinolinethiol with a thickness ranging from about 5 nanometers to about 50 nanometers; and; an organic electroluminescent device member comprised of a hole transport component of an indolocarbazole represented by (I), (II), (III), (IV), (V), or (VI).

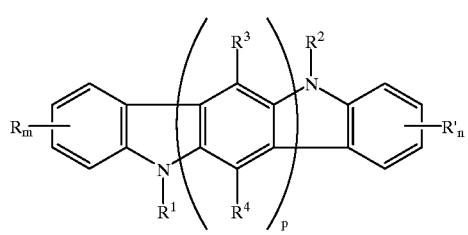

(I)

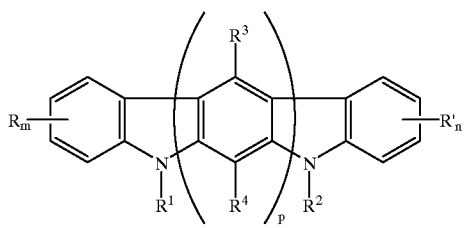

(II)

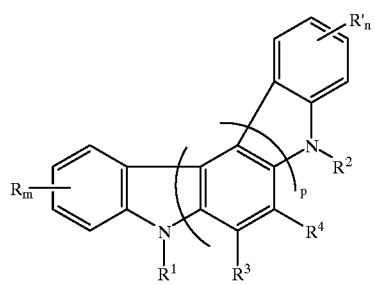

(III)

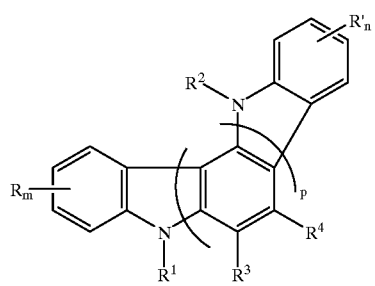

(IV)

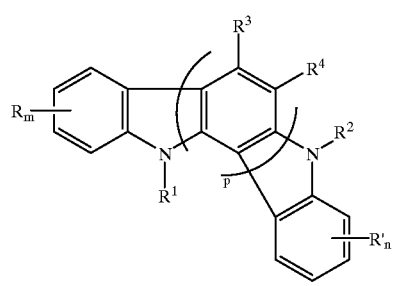

(V)

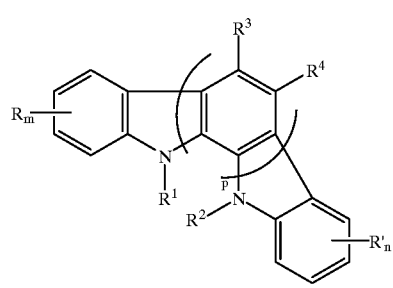

(VI)

wherein R and R' are independently selected from the group consisting of hydrogen, halogen, alkyl, alkoxyl, and aryl; m and n are numbers; R¹ and R² are independently selected from the group consisting of alkyl and aryl; R³ and R⁴ are independently selected from the group consisting of hydrogen, halogen, alkyl, alkoxy, and aryl, and p is a number.

DESCRIPTION OF EMBODIMENTS

Figure 1:
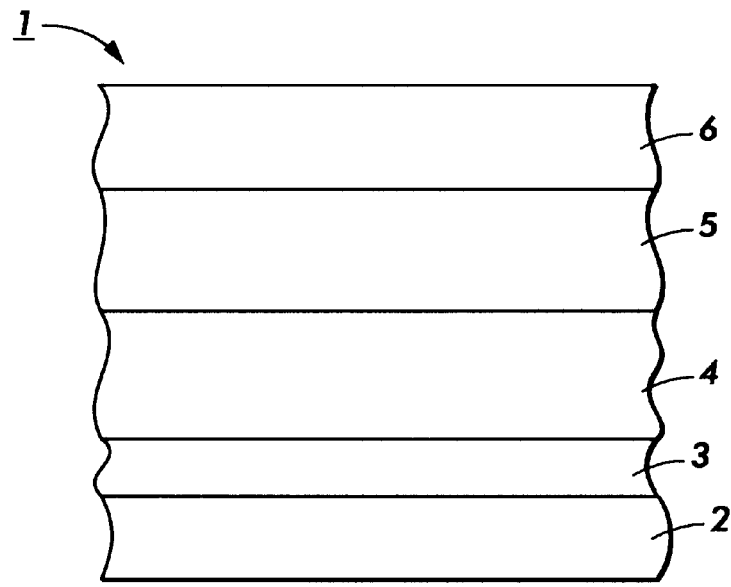
Figure 2:
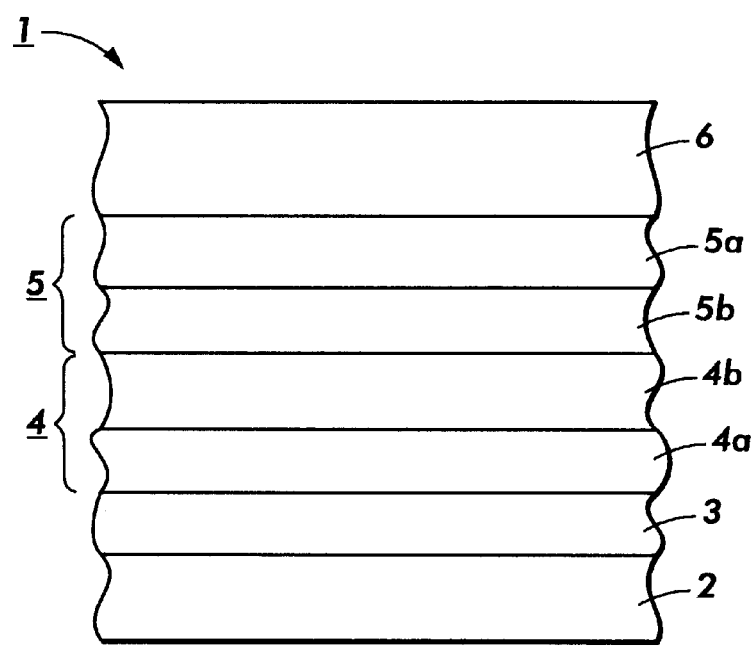

The embodiments of the present invention will be described in more details with reference to the following schematic diagrams of EL devices as depicted in FIG. 1 and FIG. 2:

FIG. 1 illustrates an EL device or an organic light emitting diode 1, comprised of a supporting substrate 2 of, for example, glass, an anode 3, an organic indolocarbazole of the formulas illustrated herein hole transporting layer 4, an organic electron transporting layer 5, and in contact therewith a cathode 6, such as a low work function metal. In this EL device, a junction is formed between the hole transporting layer, or zone and the electron transporting layer, or zone. In operation, when the anode is electrically biased to a positive potential with respect to the cathode, holes are injected into the organic hole transporting zone and transported across this zone to said junction. Concurrently, electrons are injected from the cathode into the electron transporting zone and are transported toward the same junction. Recombination of holes and electron occurs near the junction, resulting in light emission.

In another embodiment as illustrated in FIG. 2, the light emitting diode 1 is comprised of a supporting substrate 2 of, for example, glass, an anode 3, an indolocarbozale of the formulas illustrated herein, organic hole transporting zone 4, an organic electron transporting zone 5, and in contact therewith a cathode 6. In this device structure, the transporting zone is comprised of one or more transport layers as opposed to the single layer transporting zone of the device structure of FIG. 1. Specifically, the hole transporting zone 4 of FIG. 2 is comprised of a layer 4a which facilitates hole injection, and an indolocarbazole layer 4b which transports hole carriers. The electron transporting zone 5 is comprised of a layer 5a which facilitates electron injection, and a layer 5b which transports electrons.

Illustrative examples of the supporting substrate include polymeric components, glass and the like, and polyesters like MYLAR®, polycarbonates, polyacrylates, polymethacrylates, polysulfones, quartz, and the like. Other substrates can also be selected providing, for example, that the material selected can effectively support the other layers, and does not interfere with the device functional performance. The thickness of the substrate can be, for example, from about 25 to about 1,000 microns or more and, for example, from about 50 to about 500 depending, for example, on the structural demands of the device.

Examples of the anode contiguous to the substrate include positive charge injecting electrodes such as indium tin oxide, tin oxide, gold, platinum, or other materials, such as electrically conductive carbon, conjugated polymers such as polyaniline, polypyrrole, and the like, with, for example, a work function equal to, or greater than about 4 electron volts, and more specifically, from about 4 to about 6 electron volts. The thickness of the anode can range from about 10 to about 5,000 Å with the preferred range being dictated by the optical constants of the anode material. One preferred range of thickness is from about 20 to about 1,000 Angstroms (Å).

The hole transporting layer 4 illustrated herein can be of a number of convenient forms. For example, this layer may be comprised of one layer comprising one or more hole transport components, at least one of which is an indolocarbazole compound. In one preferred form, layer 4 may be laminately formed from a layer 4a in contact with the anode, and which layer contains a component which facilitates hole injection, and a layer 4b containing the indolocarbazole hole transport component. Any suitable materials which can inject holes from the anode may be employed in layer 4a, with the preferred materials being the porphyrin derivatives as disclosed in U.S. Pat. No. 4,720,432, the disclosure of which is totally incorporated herein by reference. Representative examples of porphyrin derivatives are porphyrin; 1,10,15,20-tetraphenyl-21H,23H-porphyrin copper (II); copper phthalocyanine, copper tetramethyl phthalocyanine; zinc phthalocyanine; titanium oxide phthalocyanine; magnesium phthalocyanine; and the like.

In embodiments, the hole transporting zone 4 contains at least one indolocarbazole compound of the formulas illustrated herein. These compounds offer a number of advantages as illustrated herein in that, for example, they possess a relatively high glass transition temperature, for example ranging from about 80° C. to about 200° C., and are capable of forming thermally and morphologically stable thin films by vacuum evaporation techniques.

---

Illustrative examples of indolocarbazole are (1)  5,11-di-m-tolyl-5,11-dihydroindolo[3,2-b]carbazole,
(2)  5,11-bis(3,4-dimethylphenyl)-5,11-dihydroindolo[3,2-b]carbazole,
(3)  5,11-di-1-naphthyl-5,11-dihydroindolo[3,2-b]carbazole,
(4)  5,11-bis(3-methoxyphenyl)-5,11-dihydroindolo[3,2-b]carbazole,
(5)  5,11-bis(1,1'-biphenyl-4-yl)-5,11-dihydroindolo[3,2-b]carbazole,
(6)  5,11-diphenyl-5,11-dihydroindolo[3,2-b]carbazole,
(7)  5,11-di-2-naphthyl-5,11-dihydroindolo[3,2-b]carbazole,
(8)  5,11-bis(3-chlorophenyl)-5,11-dihydroindolo[3,2-b]carbazole,
(9)  2,8-dimethyl-5,11-diphenyl-5,11-dihydroindolo[3,2-b]carbazole,
(10) 2,8-dimethyl-5,11-di-m-tolyl-5,11-dihydroindolo[3,2-b]carbazole,
(11) 2,8-dimethyl-5,11-di-m-tolyl-5,11-dihydroindolo[3,2-b]carbazole,
(12) 2,8,5,11-tetramethyl-5,11-dihydroindolo[3,2-b]carbazole,
(13) 5,11-dicyclohexyl-5,11-dihydroindolo[3,2-b]carbazole,
(14) 15,11-dicyclohexyl-2,8-dimethyl-5,11-dihydroindolo[3,2-b]carbazole,
(15) dibenzo[bl]-5,11-diphenyl-5,11-dihydroindolo[3,2-b]carbazole,
(16) 5,7-di-m-tolyl-5,7-dihydroindolo[2,3-b]carbazole,
(17) 5,7-di-1-naphthyl-5,7-dihydroindolo[2,3-b]carbazole,
(18) 5,8-di-m-tolyl-5,8-dihydroindolo[2,3-c]carbazole,
(19) 5,8-bis(3,4-dimethylphenyl)-5,8-dihydroindolo[2,3-c]carbazole,
(20) 5,8-di-1-naphthyl-5,8-dihydroindolo[2,3-c]carbazole,
(21) 5,12-di-m-tolyl-5,12-dihydroindolo[3,2-c]carbazole,
(23) 5,12-di-1-naphthyl-5,12-dihydroindolo[3,2-c]carbazole,
(24) 5,12-di-1-naphthyl-5,12-dihydroindolo[3,2-a]carbazole, and the like, and of the following formulas:

Illustrative examples of indolocarbazole are
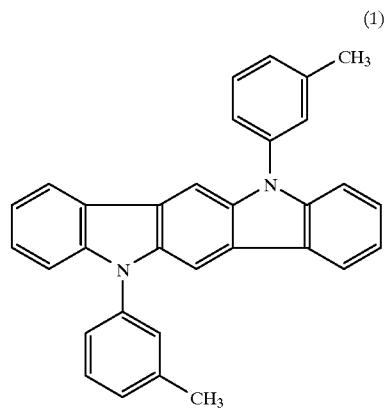
(1)
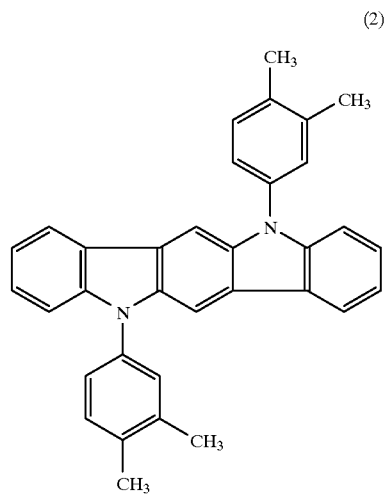
(2)
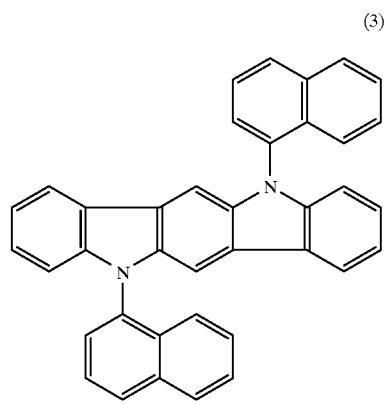
(3)

Illustrative examples of indolocarbazole are
(4)
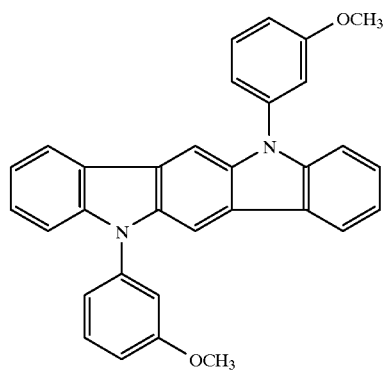
(5)
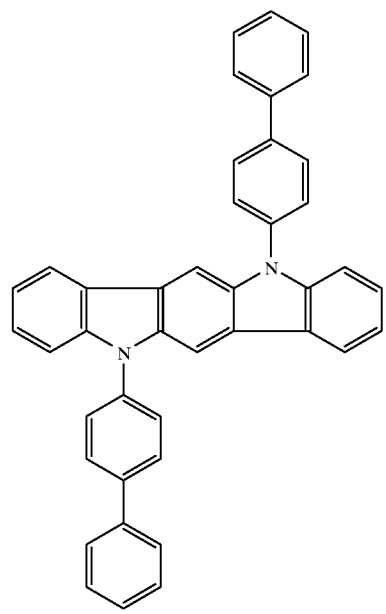
(6)
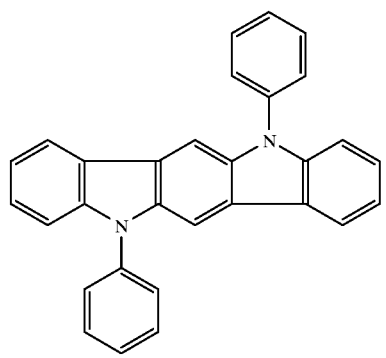

-continued
Illustrative examples of indolocarbazole are
(7)
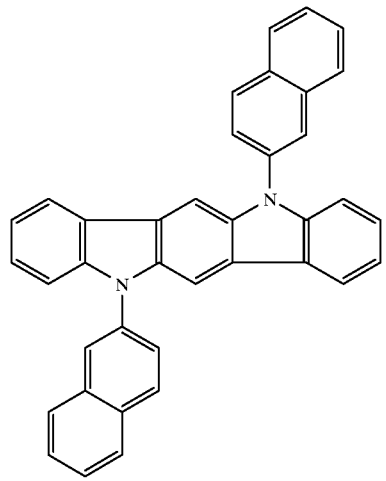
(8)
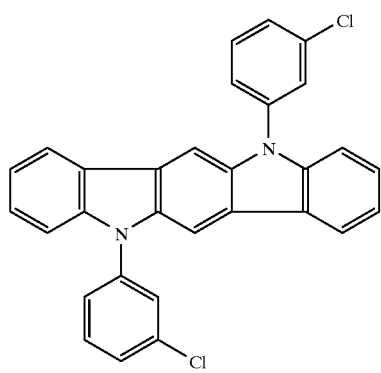
(9)
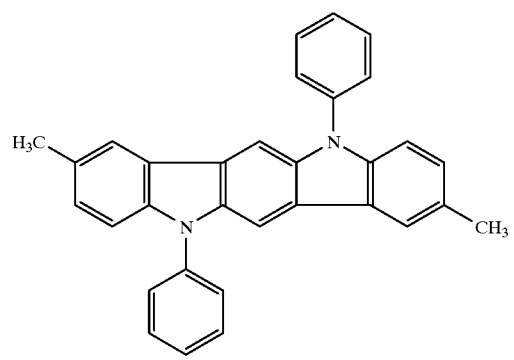

Illustrative examples of indolocarbazole are
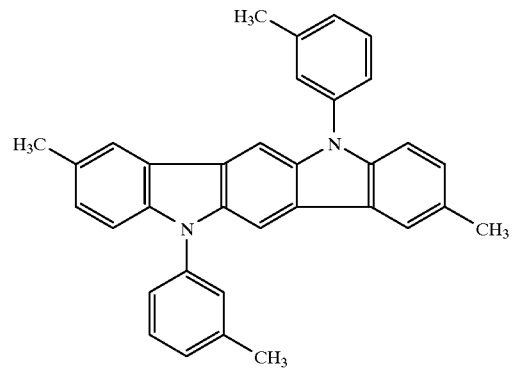
(10)
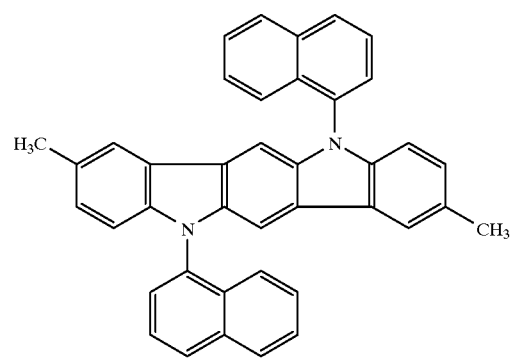
(11)
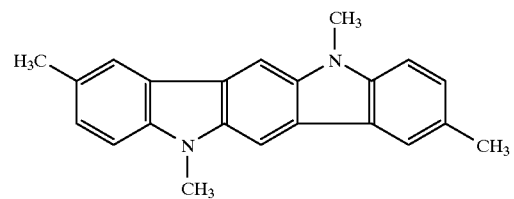
(12)
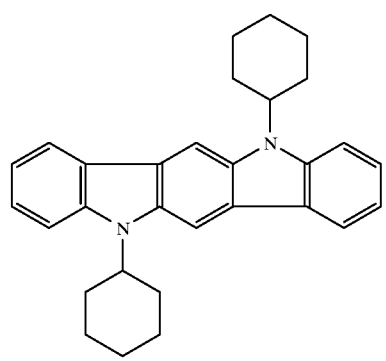
(13)

Illustrative examples of indolocarbazole are
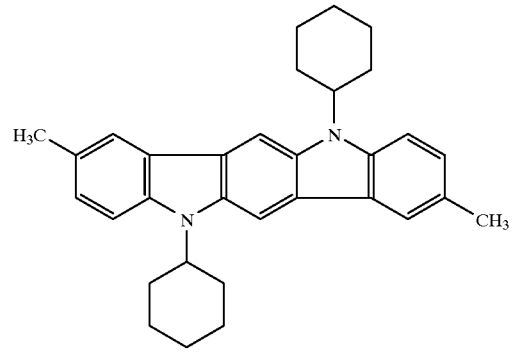
(14)
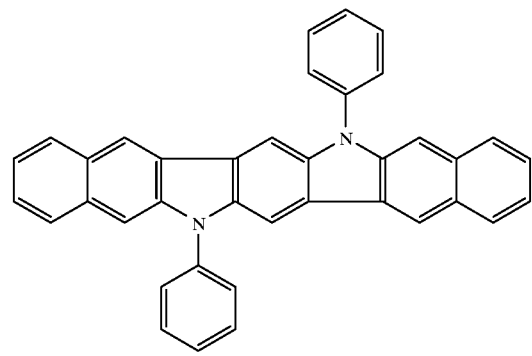
(15)
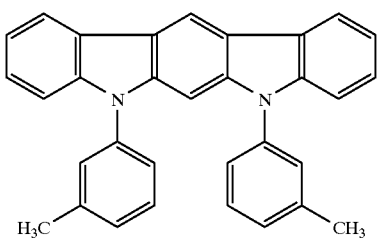
(16)
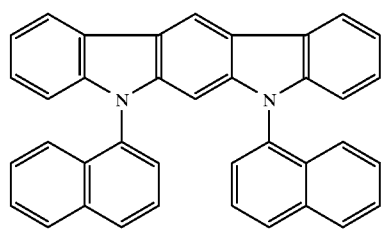
(17)

-continued
Illustrative examples of indolocarbazole are
(18)
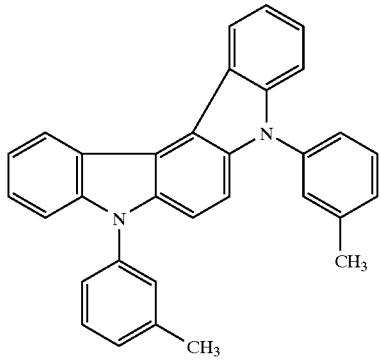
(19)
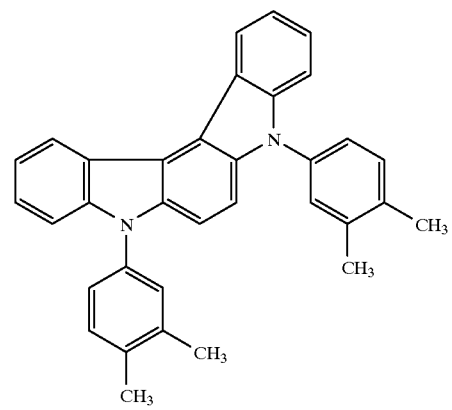
(20)
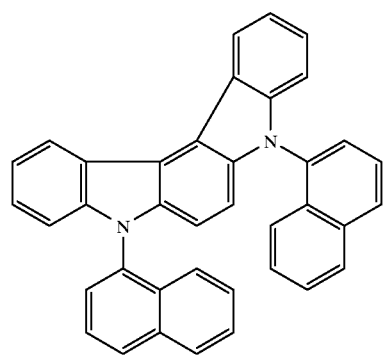

-continued

Illustrative examples of indolocarbazole are (21)

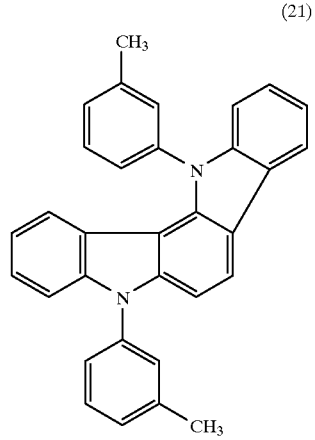

(22)

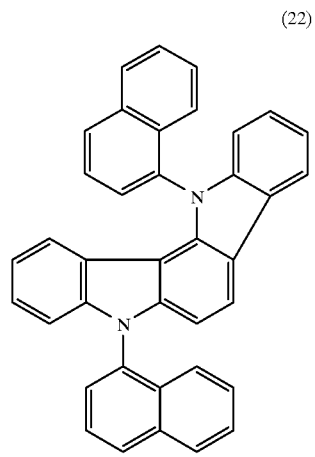

(23)

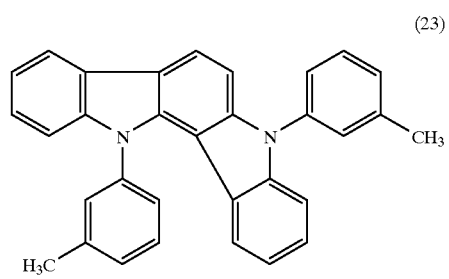

(24)

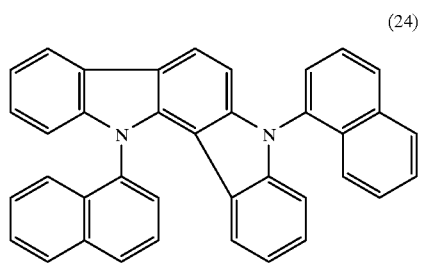

Similarly, the electron transporting layer 5 may be of a number of different convenient forms of, for example, a single layer, a dual layer, and the like. Any suitable electron transport compounds may be utilized in this zone. Examples of useful electron transport compounds include fused ring luminescent materials, such as anthracene, phenathrecene, pyrene, perylene, and the like as illustrated in U.S. Pat. No. 3,172,862; butadienes such as 1,4-diphenylbutadiene and tetraphenylbutadiene, and stilbenes, and the like as illustrated in U.S. Pat. Nos. 4,356,429 and 5,516,577; optical brightness such as those disclosed by U.S. Pat. No. 4,539, 507. The disclosures of each of these patents are totally incorporated herein by reference.

Preferred electron transport materials are metal chelates of 8-hydroxyquinoline as disclosed in U.S. Pat. Nos. 4,539, 507; 5,151,629, and 5,150,006, the disclosures of which are totally incorporated herein by reference. Illustrative examples of the metal chelates include tris(8-hydroxyquinolinate)aluminum (AlQ3), tris(8-hydroxyquinolinate)gallium, bis(8-hydroxyquinolinate) magnesium, bis(8-hydroxyquinolinate)zinc, tris(5-methyl-8-hydroxyquinolinate)aluminum, tris(7-propyl-8-quinolinolato) aluminum, bis[benzo{f}-8-quinolinate]zinc, bis(10-hydroxybenzo[h]quinolinate)berryllium, bis(2-methylquinolinolato) aluminum(III)-μ-oxo-bis(2-methyl-8-quinolinolato)aluminum(III), bis(2-methyl-8-quinolinolato) (phenolato)aluminum, bis(2-methyl-8-quinolinolato) (para-phenylphenolato) aluminum, bis(2-methyl-8-quinolinolato) (2-naphthalolato)aluminum, and the like.

Another class of preferred electron transport materials are the metal chelates disclosed in U.S. Ser. No. 829,398, the disclosure of which is totally incorporated herein by reference, and represented by the following formula

$$L_n\text{-}M^{+n} \quad \text{(VII)}$$

wherein M represents a metal, n is a number of, for example, from 1 to 3, and L is a ligand as represented by Formula (VIII

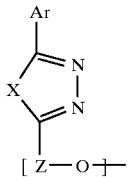

wherein Ar is an aryl group containing, for example, 6 to about 30 carbon atoms or an aromatic heterocyclic group, such as for example pyridyl, quinolyl, thienyl and the like; X is selected from the group consisting of oxygen, sulfur, and selenium; N is nitrogen, O is oxygen, and Z is an aromatic component, such as for example 1,2-phenylene, 1,2-naphthylene, 2,3-naphthylene, 3,4-pyridinediyl, 3,4-quinolinediyl, the substituted analogs thereof with the substituents being preferably alkyl containing 1 to about 5 carbon atoms, phenyl or aryl with a substituent of halogen, alkyl or alkoxy groups containing 1 to 5 carbons, halogen, alkoxy groups containing 1 to 3 carbon atoms, a carboxy group, a cyano group, and the like.

The metal ion of Formula (VII) may be monovalent, divalent, or trivalent. Illustrative examples of metal ions include those which are capable of forming a stable chelate compound with the ligand, such as for example lithium, sodium, beryllium, magnesium, zinc, and the like, with the preferred metal ions being beryllium and zinc. Illustrative examples of metal chelate compounds (VII) include bis[2-(2-hydroxyphenyl)-5-phenyl- 1,3,4-oxadiazolato]zinc; bis [2-(2-hydroxyphenyl)-5-phenyl-1,3,4-oxadiazolato] berryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis] 2-(2-hydroxyphenyl)-5-p-tolyl-1,3,4-oxadiazolato]zinc; bis] 2-(2-hydroxyphenyl)-5-p-tolyl-1,3,4-oxadiazolato] beryllium; bis]5-p-tert-butylphenyl)-2-(2-hydroxyphenyl)-1,3,4-oxadiazolato]zinc; bis]5-p-tert-butylphenyl)-2-(2-hydroxyphenyl)-1,3,4-oxadiazolato]beryllium; bis]2-(2-hydroxyphenyl)-5-(3-fluorophenyl)-1,3,4-oxadiazolato] zinc; bis]2-(2-hydroxyphenyl)-5-(4-fluorophenyl)-1,3,4-oxadiazolato]zinc; bis]2-(2-hydroxyphenyl)-5-(4-fluorophenyl)-1,3,4-oxadiazolato]beryllium; bis]5-(4-chlorophenyl)-2-(2-hydroxyphenyl)-1,3,4-oxadiazolato] zinc; bis]2-(2-hydroxyphenyl)-5-(4-methoxyphenyl)-1,3,4-oxadiazolato]zinc; bis]2-(2-hydroxy-4-methylphenyl)-5-phenyl-1,3,4-oxadiazolato]zinc; bis]2-α-(2-hydroxynaphthyl)-5-phenyl-1,3,4-oxadiazolato]zinc; bis]2-(2-hydroxyphenyl)-5-p-pyridyl-1,3,4-oxadiazolato]zinc; bis]2-(2-hydroxyphenyl)-5-p-pyridyl-1,3,4-oxadiazolato] beryllium; bis]2-(2-hydroxyphenyl)-5-(2-thiophenyl)-1,3,4-oxadiazolato]zinc; bis]2-(2-hydroxyphenyl)-5-phenyl-1,3, 4-thiadiazolato]zinc; bis]2-(2-hydroxyphenyl)-5-phenyl-1, 3,4-thiadiazolato]beryllium; bis]2-(2-hydroxyphenyl)-5-(1-naphthyl)-1,3,4-thiadiazolato]zinc; bis]2-(2-hydroxyphenyl)-5-(1-naphthyl)-1,3,4-thiadiazolato] beryllium; and the like.

In embodiments of the present invention, the total thickness of the luminescent medium, which includes the hole transporting layer 4 and the electron transporting zone 5, is preferably less than about 1 micron to, for example, maintain a current density conducive to efficient light emission under a relatively low applied voltage across the electrodes. Suitable thickness of the hole transporting zone can range from about 50 to about 2,000 Å, with the preferred thickness being from about 400 to about 1,000 Å. Similarly, the thickness of the electron transporting zone can range from about 50 to about 2,000 Å, with the preferred thickness being from about 400 to about 1,000 Å. Each of the layers between the anode and cathode, such as the hole transport and electron transport layers, can be of various suitable thickness, such as from about 50 to about 125 nanometers.

The cathode 6 can be comprised of any suitable metal, including high, for example from about 4.0 eV to about 6.0 eV, or low work function metals, such as metals with, for example, an eV of from about 2.5 eV to about 4.0 eV (electron volts). The cathode can be derived from a combination of a low work function metal (less than about 4 eV) and at least one other metal. Effective proportions of the low work function metal to the second or other metal are from less than about 0.1 percent to about 99.9 percent by weight. Illustrative examples of low work function metals include alkaline metals such as lithium or sodium, Group 2A or alkaline earth metals such as beryllium, magnesium, calcium, or barium, and Group III metals including rare earth metals and the actinide group metals such as scandium, yettrium, lanthanum, cerium, europium, terbium, or actinium. Lithium, magnesium and calcium are the preferred low work function metals in embodiments of the present invention.

The thickness of cathode 6 ranges from, for example, about 10 to about 5,000 Å. The Mg:Ag cathodes, reference U.S. Pat. No. 4,885,211, constitute one preferred cathode. Another preferred cathode construction is described in U.S. Patent 5,429,884, wherein the cathodes are formed from lithium alloys with other high work function metals such as aluminum and indium. The disclosures of each of these patents is totally incorporated herein by reference.

Both anode 3 and cathode 6 of the EL devices of the present invention can be of any convenient forms. A thin conductive layer can be coated onto a light transmissive substrate, for example a transparent or substantially transparent glass plate or plastic film. The EL device can include a light transmissive anode 3 formed from tin oxide or indium tin oxide coated on a glass plate. Also, very thin, for example less than about, or equal to about 200 Å, light-transparent metallic anodes can be used, such as gold, palladium, and the like. In addition, transparent or semitransparent thin layers, such as about 40 to about 100 nanometers, of conductive carbon or conjugated polymers, such as polyaniline, polypyrrole, and the like, can be selected as anodes. Any suitable light transmissive polymeric film can be employed as the substrate. Additional suitable forms of the anode 3 and cathode 6 are illustrated by U.S. Pat. No. 4,885,211.

The indolocarbazole hole transport compounds can be prepared by various suitable methods, for example they can be prepared by Ullmann condensation of the corresponding dihydroindolocarbazole precursors selected from those represented by Formulas (Ib) through (VIb) with aryl halide in the presence of a copper catalyst, especially a ligand copper catalyst as illustrated in copending applications U.S. Ser. No. 791,694, U.S. Ser. No. 791,696, U.S. Ser. No. 790,669; and U.S. Pat. Nos. 5,538,829; 5,648,542; 5,654,482 and 5,648,539, the disclosures of each being totally incorporated herein by reference. Specific examples of dihydroindolocarbazoles, which can be readily obtained by known literature processes, are 5,11-dihydroindolo[3,2-b]carbazole, 5,7-dihydroindolo[2,3-b]carbazole, 5,12-dihydroindolo[3,2-c]carbazole, 5,10-dihydroindolo[3,2-a]carbazole, 11,12-dihydroindolo[2,3-a]carbazole, and the like. A typical process for one of the dihydroindolocarbazole derivatives, 5,11-dihydroindolo[3,2-b]carbazole, is described in Example I.

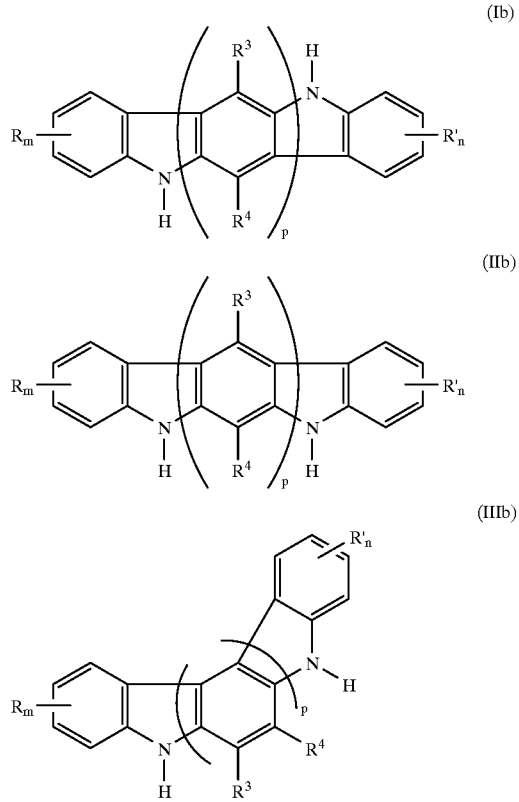

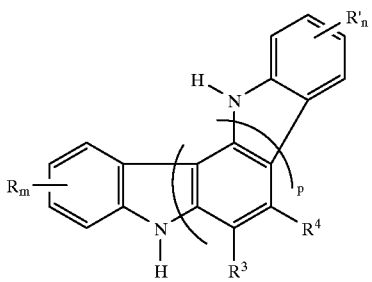

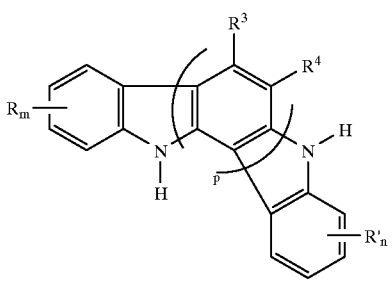

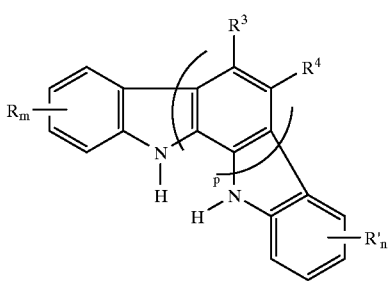

wherein R and R' are independently selected from the group consisting of hydrogen atom, halogen atom, alkyl, alkoxyl, and aryl; m and n are numbers of 0 to 4; $R^3$ and $R^4$ are hydrogen, alkyl, alkoxy, aryl, or halogen, and p is a number of from 1 to 3.

Illustrative examples of aryl halides that can be utilized for the Ullmann condensation are iodobenzene, 3-iodotoluene, 4-iodotoluene, 4-iodo-1,2-xylene, 1-iodonaphthalene, 2-iodonaphthalene, 4-iodobiphenyl, 4-dodo-4'-(3-methyldiphenylamino)-1,1'-biphenyl, 4-dodo-4'-(diphenyl amino)-1,1'-biphenyl, N,N-diphenyl-4-iodoaniline, N-phenyl-N-3-tolyl-4-iodoaniline, and the like. The Ullmann condensation is generally accomplished in an inert solvent, such as dodecane, tridecane, xylene, sulfolane, high boiling petroleum ethers with boiling point of, for example, over about 150° C., and the like, at a reaction temperature ranging from 90° C. to about 300° C., and preferably from about 150° C. to 250° C. Copper catalysts suitable for Ullmann condensation, including copper powder, copper (I) oxide, copper (I) chloride, copper (II) sulfate, copper (II) acetate, and the like, and the ligand copper catalysts of the copending applications and patents mentioned herein, may be selected for the process of the present invention. An effective molar ratio of the copper catalyst to the dihydroindolocarbazole compound ranges, for example, from about 0.01 to about 0.5. The condensation reaction can be accelerated with a base, such as for example an alkaline metal hydroxide or carbonate including potassium hydroxide, potassium carbonate, sodium hydroxide, and the like. After the condensation, the reaction mixture is cooled down to about room temperature, and the product is isolated by known separation techniques, such as for example by filtration and chromatography. The product is generally characterized by known analytical techniques, such as IR and NMR.

The substituents, such as for example $R^3$ and $R^4$, can be positioned at various different appropriate locations on the aromatic componentns, like the benzene ring.

The following Examples are provided to further define various species of the present invention, it being noted that these Examples are intended to illustrate and not limit the scope of the present invention. Comparative Examples and data are also provided.

EXAMPLE I

Synthesis of 5,11-di-m-tolyl-5,11-dihydroindolo[3,2-b] carbazole (1):

A 200 milliliter 3-necked round bottom flask equipped with a mechanical stirrer, reflux condenser, and argon inlet was purged with argon and then charged with 5,11-dihydroindolo[3,2-b]carbazole (5.1 grams, 0.02 mol), 3-iodotoluene (8.69 grams, 0.04 mol), copper sulfate pentahydrate (0.25 gram, 1.0 mmol), potassium carbonate (5.52 grams, 0.04 mol), and n-tridecane (5.0 milliliters). Under an argon atmosphere, the reaction mixture was heated to about 250° C. with a heating mantle and allowed to proceed at that temperature until chromatographic analysis indicated that the reaction was complete after approximately 6 hours. The heating mantle was removed and the mixture was cooled to about 100° C., and 100 milliliters of toluene and 15 milliliters of water were then added with vigorous stirring. The resulting two phase mixture was transferred into a separatory funnel and the layers separated. The organic phase, which contains the desired product and solvent mixture, was washed with water and treated under argon with 25 grams of alumina. After the alumina was filtered off, the organic phase was evaporated to remove most of the toluene. The above product was obtained by recrystallization of the residue from cyclohexane. Yield: 6.8 grams. IR (Kbr): 1,604, 1,588, 1,490, 1,475, 1,450, 1,321, 1,201, 1,153, 760, 745, 701 $cm^{-1}$. $^1$H-NMR (CDCl$_3$): δ2.51 (s), 7.18–7.59 (m), 8.05 (s), 8.12 (d, J=8.5 Hz).

EXAMPLE II

Synthesis of 5,11-di-bis(3,4-dimethylphenyl)-m-5,11-dihydroindolo [3,2-b]-carbazole (2):

A 200 milliliter 3-necked round bottom flask equipped with a mechanical stirrer, reflux condenser, and argon inlet was purged with argon and then charged with 5,11-dihydroindolo[3,2-b]carbazole (5.1 grams, 0.02 mol), 3-iodotoluene (9.28 grams, 0.04 mol), copper sulfate pentahydrate (0.25 gram, 1.0 mmol), potassium carbonate (5.52 grams, 0.04 mol), and n-tridecane (5.0 milliliters). Under an argon atmosphere, the reaction mixture was heated to about 250° C. with a heating mantle and allowed to proceed at that temperature until chromatographic analysis indicated that the reaction was complete after approximately 6 hours. The heating mantle was removed and the mixture was cooled to about 100° C., and 100 milliliters of toluene and 15 milliliters of water were then added with vigorous stirring. The resulting two phase mixture was transferred into a separatory funnel and the layers separated. The organic phase, which contains the desired product and the solvent mixture, was washed with water and treated under argon with 25 grams of alumina. After the alumina was filtered off, the organic phase was evaporated to remove most of the toluene. The product was then obtained by recrystallization of the aforementioned residue from cyclohexane. Yield: 7.5 grams. IR (Kbr): 1,614, 1,605, 1,511, 1,458, 1,445, 1,324, 1,241, 1,183, 851, 747, 743 $cm^{-1}$. $^1$H-NMR (CDCl$_3$):, δ2.42(s), 2.44 (s), 7.14–7.47 (m), 8.03 (s), 8.12 (d, J,=,8.5 Hz).

EXAMPLE III

Synthesis of 5,11-di-1-naphthyl-5,11-dihydroindolo[3,2-b] carbazole (3):

A 200 milliliter 3-necked round bottom flask equipped with a mechanical stirrer, reflux condenser, and argon inlet was purged with argon and then charged with 5,11-dihydroindolo[3,2-b]carbazole (5.1 grams, 0.02 mol), 1-iodonaphthalene (10.16 grams, 0.04 mol), copper sulfate pentahydrate (0.25 gram, 1.0 mmol), potassium carbonate (5.52 grams, 0.04 mol), and n-tridecane (5.0 milliliters). Under an argon atmosphere, the reaction mixture was heated to about 250° C. with a heating mantle and allowed to proceed at this temperature to completion in about 6 hours. The reaction mixture was cooled to about 100° C., and 100 milliliters of toluene and 15 milliliters of water were then added with vigorous stirring for 30 minutes. The resulting two phase mixture was transferred into a separatory funnel and the layers separated. The organic phase, which contains the desired product and the solvent mixture, were washed with water, treated under argon with 25 grams of alumina, and filtered. The filtrate was evaporated and the residue was recrystallized from toluene to provide 2.5 grams of pure, about 99.5 percent, 5,11-di-1-naphthyl-5,11-dihydroindolo [3,2-b]carbazole (3).

EXAMPLE IV

Illustrative organic EL devices were prepared in the following manner:

1. An indium tin oxide (ITO, 50 nanometers) coated glass (1.0 millimeter) was cleaned with a commercial detergent, rinsed with deionized water and dried in a vacuum oven at 60° C. for 1 hour. Immediately before use, the glass was treated with UV ozone for 0.5 hour.
2. The above ITO substrate 1, was placed in a vacuum deposition chamber. The deposition rate and layer thickness were controlled by an Inficon Model IC/5 controller. Under a pressure of about 5×10$^{-6}$ torr a dihydroindolo[3,2-b]carbazole compound of Examples I, II, or III, was evaporated from an electrically heated tantalum boat to deposit an 80 nanometer hole transporting layer on the ITO glass. The deposition rate of the indolocarbazole compound was controlled at 0.6 nanometer/second.
3. Onto the dihydroindolo[3,2-b]carbazole layer 2, was deposited tris(8-hydroxyquinolinate)aluminum at an evaporation rate of 0.6 nanometer/second to form an 80 nanometer electron transporting layer which can also function as a luminescent zone.
4. A 100 nanometer magnesium cathode silver alloy was deposited at a total deposition rate of 0.5 nanometer/second onto the electron transporting layer 3 by simultaneous evaporation from two independently controlled tantalum boats containing Mg and Ag, respectively. The typical composition was 9:1 in atomic ratio of Mg to Ag. Finally, a 200 nanometer silver layer was overcoated on the Mg:Ag cathode for the purpose of protecting the reactive Mg from ambient moisture.

The devices as prepared above were retained in a dry box under a nitrogen atmosphere. Their performance was assessed by measuring the current-voltage characteristics and light output under a direct current measurement. The current-voltage characteristics were determined with a Keithley Model 238 High Current Source Measure Unit. The ITO electrode was connected to the positive terminal of the current source. At the same time, the light output from the device was monitored by a silicon photodiode.

The devices were evaluated under a constant current density of 25 mA/cm². The device's operation life was assessed by measuring the time elapsed to reduce the light intensity of the device to half of its original value. The initial light intensity ($L_0$), initial operation voltages ($V_0$), and operation life of the devices utilizing dihydroindolo[3,2-b] carbazole compounds are summarized in the following table:

| Compound No. | $L_0$ (cd/m²) | $V_0$ (V) | Operation Life (hours) |
| --- | --- | --- | --- |
| 1 | 560 | 9.5 | 250 |
| 2 | 580 | 9.2 | 200 |
| 3 | 575 | 9.8 | 300 |

These results demonstrate that a sustained high level of light output can be achieved in the EL devices utilizing the indolocarbazole hole transport component. Furthermore, these devices displayed no change in their current-light intensity characteristics even after they were subjected to a temperature of 60° C. for 72 hours.

COMPARATIVE EXAMPLES

A controlled organic EL device was prepared in accordance with the procedure of Example V except that N,N'-bis(3-methylphenyl)-N,N'-diphenyl-4,4'-diaminobiphenyl, a triphenylamine based hole transport molecule commonly selected for a number of prior art EL devices, was utilized in place of 5,11-di-m-tolyl-5,11-dihydroindolo[3,2-b] carbazole. The performance characteristics of the device were evaluated in a similar manner to the above EL Example. The device provided an initial light intensity of 570 cd/m² at an operating voltage of 9.5 volts as measured under a constant current density of 25 mA/cm². The light intensity degraded rapidly, and registered a 50 percent reduction after 90 hours of continuous operation. Furthermore, this device displayed substantial change in its current-light intensity characteristics after it was subjected to a temperature of 60° C. for 72 hours.

Another controlled organic EL device was also prepared in accordance with the procedure of Example V except that 1,1-bis(4-di-tolylaminophenyl)cyclohexane was utilized in place of 5,11-di-m-tolyl-5,11-dihydroindolo[3,2-b] carbazole. The performance characteristics of the device were evaluated in a similar manner. The device provided an initial light intensity of 450 cd/m² at an operating voltage of 11.5 volts. The light intensity degraded rapidly, and registered a 50 percent reduction after 60 hours of continuous operation.

Other modifications of the present invention will occur to those of ordinary skill in the art subsequent to a review of the present application. These modifications, and equivalents thereof are intended to be included within the scope of the invention.

What is claimed is:

1. An organic electroluminescent device comprised of an anode, a cathode and a charge transport component of an indolocarbazole represented by Formulas (I), (II), (III), (IV), (V), or (VI); or optionally mixtures thereof

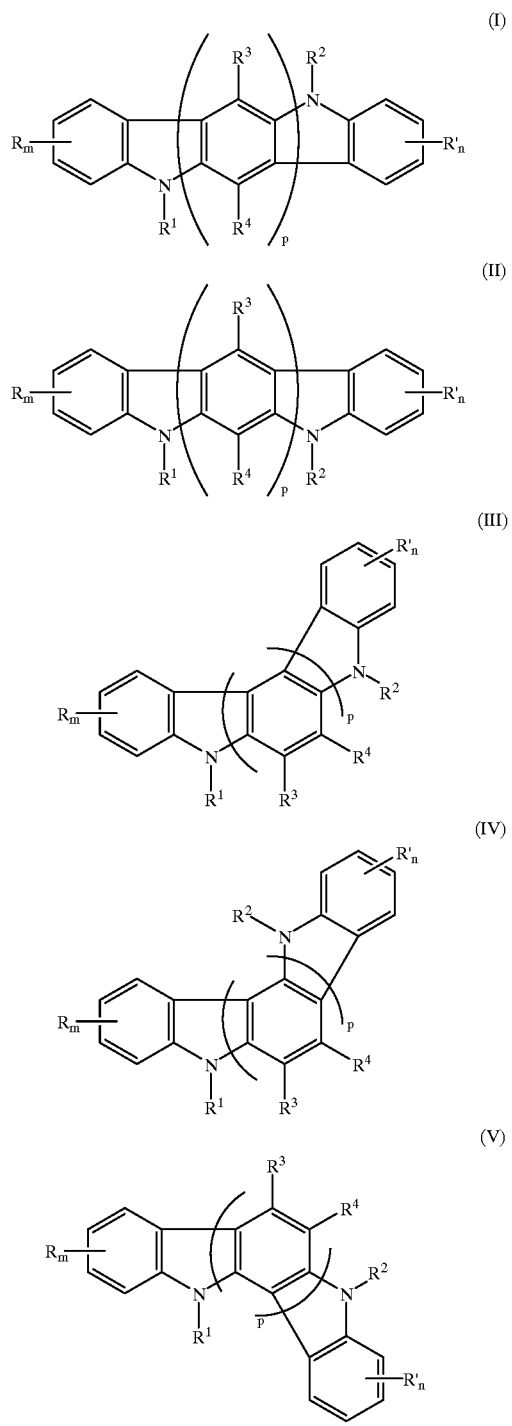

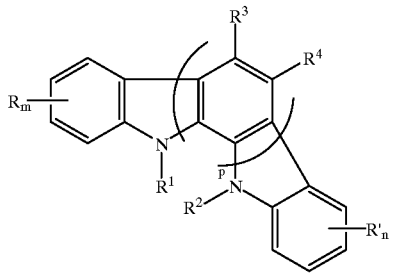

(VI)

wherein R and R' are independently selected from the group consisting of a hydrogen atom, halogen atom, alkyl, alkoxyl, and aryl; m and n are numbers of 0 to 4; $R^1$ and $R^2$ are independently selected from the group consisting of alkyl, aryl, and vinyl; $R^3$ and $R^4$ are independently selected from the group consisting of a hydrogen atom, halogen atom, alkyl, alkoxy, and aryl, and p is a number of from 1 to 3.

2. A charge transfer component in accordance with claim 1 wherein aryl is a fused aromatic ring.

3. A charge transfer component in accordance with claim 2 wherein said fused ring is benzo.

4. A charge transfer component in accordance with claim 1 wherein alkyl contains from 1 to about 25 carbon atoms, alkoxy contains from 1 to about 25 carbon atoms, and aryl contains from 6 to about 30 carbon atoms.

5. A charge transfer component in accordance with claim 1 wherein alkyl contains from 1 to about 10 carbon atoms, alkoxy contains from 2 to about 12 carbon atoms, and aryl contains from 6 to about 18 carbon atoms.

6. A charge transfer component in accordance with claim 1 wherein alkyl contains from 1 to about 6 carbon atoms, and wherein alkoxy contains from 1 to about 6 carbon atoms.

7. A charge transfer component in accordance with claim 1 wherein alkyl is methyl, ethyl, propyl, butyl, pentyl, heptyl, or hexyl, and wherein alkoxy is methoxy, ethoxy, propoxy, butoxy, pentoxy, or heptoxy.

8. A charge transfer component in accordance with claim 1 wherein said halogen atom is an atom of chlorine, bromine, fluorine, or iodine.

9. A charge transfer component in accordance with claim 1 wherein aryl is phenyl.

10. A charge transfer component in accordance with claim 1 wherein m and n are the numbers 1, 2, 3, or 4.

11. A charge transfer component in accordance with claim 1 wherein R and R' are hydrogen, or alkyl, and $R^1$ and $R^2$ are aryl.

12. A charge transfer component in accordance with claim 11 wherein $R^3$ and $R^4$ are hydrogen atoms.

13. A charge transfer component in accordance with claim 1 wherein $R^1$ and $R^2$ are independently selected from the group consisting of phenyl, naphthyl, and biphenyl.

14. A charge transfer component in accordance with claim 1 wherein indolocarbazole (I), or (II) is selected.

15. A charge transfer component in accordance with claim 1 wherein said indolocarbazole is 5,11-di-m-tolyl-5,11-dihydroindolo[3,2-b]carbazole, 5,11-bis(3,4-dimethylphenyl)-5,11-dihydroindolo[3,2-b]carbazole, 5,11-di-1-naphthyl-5,11-dihydroindolo[3,2-b]carbazole, 5,11-bis(3-methoxyphenyl)-5,11-dihydroindolo[3,2-]carbazole, 5,11-bis(11'-biphenyl-4-yl)-5,11-dihydroindolo[3,2-b]carbazole, 5,11-di-2-naphthyl-5,11-dihydroindolo[3,2-b]carbazole, or 2,8-dimethyl-5,11-di-1-naphthyl-5,11-dihydroindolo[3,2-b]carbazole.

16. A charge transfer component in accordance with claim 1 wherein $R^1$ and $R^2$ are phenyl, biphenyl, naphthyl, or thienyl.

17. An organic electroluminescent charge transfer component in accordance with claim 1 wherein aryl contains from 6 to about 30 carbons, wherein $R^1$ and $R^2$ are aryl groups; R and R' are hydrogen atoms or methyl groups; $R^3$ and $R^4$ are hydrogen atoms; and p is 1.

18. A charge transfer component in accordance with claim 1 wherein said indolocarbazole compound is selected from the group consisting of 5,11-di-m-tolyl-5,11-dihydroindolo[3,2-b]carbazole, 5,11-bis(3,4-dimethylphenyl)-5,11-dihydroindolo[3,2-b]carbazole, 5,11-di-1-naphthyl-5,11-dihydroindolo [3,2-b]carbazole, 5,11-bis(3-methoxyphenyl)-5,11-dihydroindolo[3,2-b]carbazole, 5,11-bis(1,1'-biphenyl-4-yl)-5,11-dihydroindolo[3,2-b]carbazole, 5,11-di-2-naphthyl-5,11-dihydroindolo[3,2-b]carbazole, 2,8-dimethyl-5,11-di-1-naphthyl-5,11-dihydroindolo[3,2-b]carbazole, 5,7-di-m-tolyl-5,7-dihydroindolo[2,3-b]carbazole, 5,7-di-1-naphthyl-5,7-dihydroindolo[2,3-b]carbazole, 5,8-di-m-tolyl-5,8-dihydroindolo[2,3-c]carbazole, 5,8-bis-(3,4-dimethylphenyl)-5,8-dihydroindolo[2,3-c]carbazole, and 5,12-di-1-naphthyl-5,12-dihydroindolo[3,2-a]carbazole.

19. An organic electroluminescent device in accordance with claim 1 wherein said indolocarbazole compound is selected from a group consisting of 5,11-di-m-tolyl-5,11-dihydroindolo[3,2-b]carbazole, 5,11-bis(3,4-dimethylphenyl)-5,11-dihydroindolo[3,2-b]carbazole, 5,11-di-1-naphthyl-5,11-dihydroindolo[3,2-b]carbazole, 5,11-bis(3-methoxyphenyl)-5,11-dihydroindolo[3,2-b]carbazole, 5,11-bis(1,1'-biphenyl-4-yl)-5,11-dihydroindolo[3,2-b]carbazole, 5,11-di-2-naphthyl-5,11-dihydroindolo[3,2-b]carbazole, and 2,8-dimethyl-5,11-di-1-naphthyl-5,11-dihydroindolo[3,2-b]carbazole, and said member includes a charge injecting layer and thereover an electron transport layer and an electron injector layer.

20. A charge transfer component in accordance with claim 1 further including a supporting substrate, a hole transporting layer, an electron transporting layer, and wherein said anode is comprised of a layer of indium tin oxide with a thickness ranging from about 30 nanometers to about 100 nanometers, wherein said hole transport layer contains at least one of said indolocarbazole compounds with a thickness ranging from about 10 nanometers to about 100 nanometers; said electron transporting layer is comprised of a layer of a metal chelate compound with a thickness ranging from about 10 nanometers to about 100 nanometers; and said cathode is a magnesium/silver alloy or a lithium/aluminum alloy, and which cathode is of a thickness ranging from about 10 nanometers to about 200 nanometers.

21. A charge transfer component in accordance with claim 1 further including a substrate, and situated between the anode and cathode a hole injector layer, a charge transporting indolocarbazole layer, an electron transport layer, and an electron injector layer.

22. A device in accordance with claim 21 wherein the anode is indium tin oxide with a thickness ranging from about 30 nanometers to about 100 nanometers, the cathode is a magnesium silver alloy, the hole injector layer is comprised of a porphyrin compound with a thickness ranging from about 5 nanometers to about 50 nanometers, the charge transporting layer is a hole transporting layer comprised of said indolocarbazole compound with a thickness ranging from about 10 nanometers to about 80 nanometers, the electron transport is comprised of a metal chelate compound of 8-hydroxyquinoline with a thickness ranging from about 10 nanometers to about 80 nanometers, and the electron injector is comprised of a metal chelate compound of 8-quinolinethiol with a thickness ranging from about 5 nanometers to about 50 nanometers.

* * * * *